(12) United States Patent
McHugh et al.

(10) Patent No.: US 6,179,624 B1
(45) Date of Patent: Jan. 30, 2001

(54) LAND GRID ARRAY CONNECTOR

(75) Inventors: Robert G. McHugh, Evergreen, CO (US); Nick Lin, Hsin-Chuang (TW); HanChen Tan, Alameda, CA (US); Jwomin Wang, Hsin-Dan (TW)

(73) Assignee: Hon Hai Precision Ind. Co., Ltd., Taipei Hsien (TW)

( * ) Notice: Under 35 U.S.C. 154(b), the term of this patent shall be extended for 0 days.

(21) Appl. No.: 09/434,593

(22) Filed: Nov. 5, 1999

(51) Int. Cl.[7] ................................................... H01R 12/00
(52) U.S. Cl. ............................................. 439/71; 439/66
(58) Field of Search .................... 439/66, 71, 83

(56) References Cited

U.S. PATENT DOCUMENTS 5,378,160  *  1/1995  Yumibe et al. ..................... 439/66
5,653,598  *  8/1997  Grabbe ............................... 439/66
5,984,693  * 11/1999  McHugh et al. ................... 439/66

* cited by examiner

Primary Examiner—Gary F. Paumen
(74) Attorney, Agent, or Firm—Wei Te Chung (57) ABSTRACT

A contact comprises a plate, a positioning section connected to the plate via a first flexible neck and adapted to be mounted by an external solder ball, a contacting section located above and connected to the positioning section via a second flexible neck. The first flexible neck is deformable to absorb a tension originated from the plate. The second flexible neck is deformable to force the contacting section to abut against an external electrical device when the external electrical device urges the contacting section to electrically connect to the solder ball via the contact.

3 Claims, 7 Drawing Sheets

LAND GRID ARRAY CONNECTOR

BACKGROUND OF THE INVENTION

1. Field of the Invention

The present invention relates to a land grid array (LGA) connector for electrically connecting a CPU to a printed circuit board, especially an LGA connector combined with a ball grid array technique for simultaneously connecting to the CPU by urging and connecting to the printed circuit board by solder balls.

2. The Prior Art

Land grid array (LGA) connectors are commonly used with IC packages and do not require soldering procedures during engagement between the LGA connector and a related printed circuit board (PCB). Normally, an LGA assembly includes an IC package having a plurality of flat contact pads formed on a bottom surface thereof, a connector having an insulative housing and defining a plurality of passageways therethrough, and a plurality of conductive contacts received in the passageways of the connector. Fastening means comprises a top plate positioned on a top surface of the IC package, a bottom plate positioned on a bottom surface of the PCB, and a plurality of sets of aligned holes defined through the PCB. The fastening means is used to configure the assembly. Each set of aligned holes receives a screw therein which engages with a washer and a nut thereby sandwiching the LGA assembly between the top and bottom plates of the fastening means.

Figure 10:
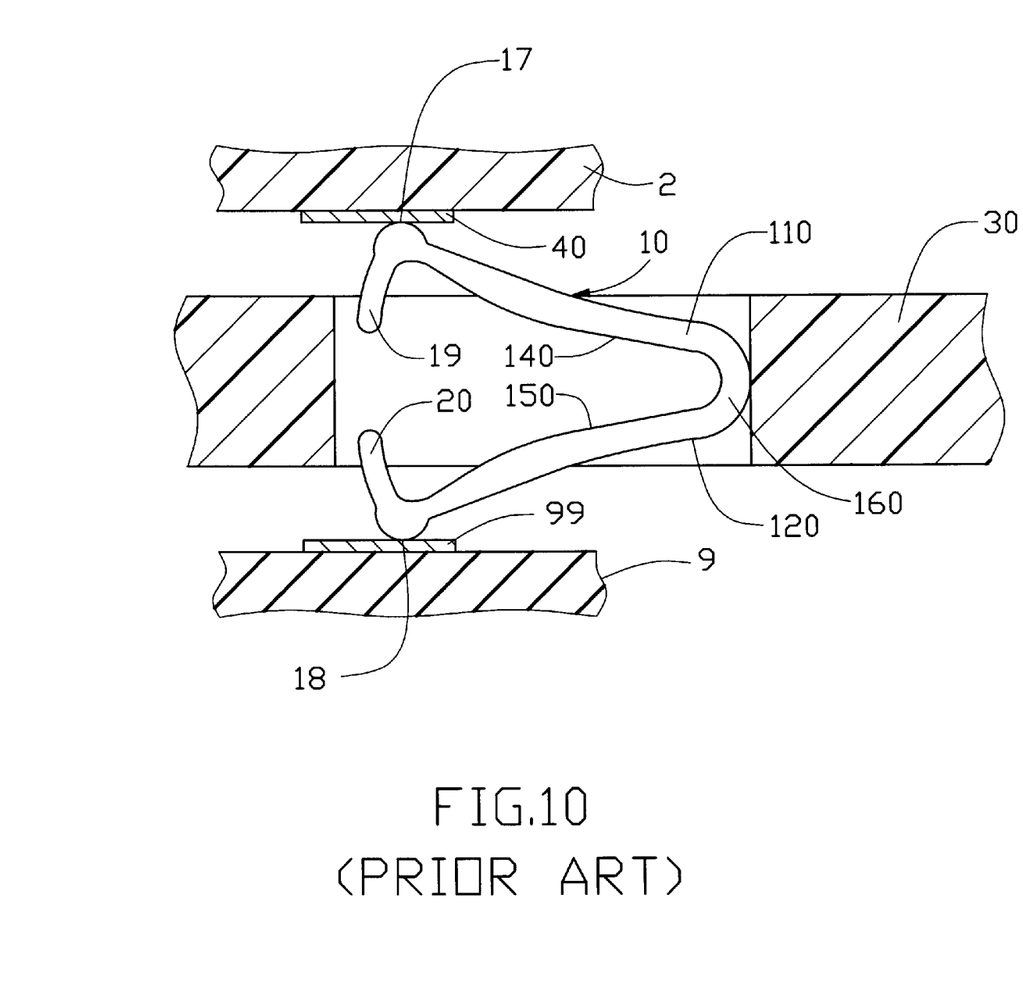
FIG. 10 is a schematic view of a conventional contact received in an LGA connector and sandwiched between an IC package and a printed circuit board.

U.S. Pat. No. 5,653,598 discloses an electrical contact for use in a connector 30 between mutually opposed electrical interfaces 40, 99 such as contact pads respectively formed on an IC package 2 and a printed circuit board 9, as shown in FIG. 10. The conventional contact comprises a generally planar contact body 10 having first and second major faces 110, 120. The body includes a pair of spaced apart spring arms 140, 150 connected by a resilient bight portion 160. The spring arms 140, 150 each have a free end with an outwardly facing edge forming a contact nose 17, 18 for engaging with the corresponding interface 40, 99. Shorting sections 19, 20 generally extend toward each other from the free ends and are offset such that, upon deflection of the spring arms 140, 150 toward each other, the shorting sections 19, 20 overlap and the first major face 110 engages the second major face 120. Thus, a shortened electrical path is formedbetween the contact noses 17, 18 when the package 2 is urged against the connector 30.

With the conventional LGA connector, the shorting sections 19, 20 may not properly contact each other due to unwanted lateral deflection thereof when the bight of the contact is deformed. Although the inner wall of the passageway receiving the contact may be used to limit the lateral deflection of the shorting sections 19, 20, unwanted scraping of the shorting sections 19, 20 against the inner wall of the passageway may occur thereby adversely affecting the proper overlap of the two shorting sections 19, 20. Proper overlap and engagement of the two shorting sections 19, 20 is difficult to achieve with this structure. Moreover, an additional contact resistance exists between the shorting sections 19, 20 thereby adversely affecting the signal transmission.

Additionally, the conventional LGA connector is in advance fixed in a motherboard via screws in a pre-assembly procedure. In a final assembly procedure, the screws have to be released first and then fastened for urging the CPU to the LGA connector. Therefore, in the total assembly procedure, the screws have to be fastened, released, and fastened again. This is cumbersome and not accepted by most mother board manufacturers.

Moreover, the contact noses 17, 18 each have a relatively small contacting surface abutting against the interface 40, 99 thereby causing a relatively high contacting resistance and affecting the transmission of signals.

It is requisite to provide a new LGA connector for solving the above problems.

SUMMARY OF THE INVENTION

The primary purpose of the present invention is to provide a new LGA contact which has a positioning section for connection to a printed circuit board via a solder ball in advance and a resilient contacting section for connection to a CPU via urging.

Another purpose of the present invention is to provide a new LGA connector which has new LGA contacts each of which may be partially surface mounted to a printed circuit board via a solder ball and partially connected to a CPU by urging.

Still another purpose of the present invention is to provide a new LGA connector having solder balls mounted thereon and having special structure for preventing wicking problem during a soldering procedure.

Further a purpose of the present invention is to provide a new LGA connector which has a special structure for decreasing contacting resistance associated with an external electrical device which urges the LGA connector.

In accordance with one aspect of the present invention, a contact comprises a plate, a positioning section connected to the plate via a first flexible neck and adapted to be mounted by an external solder ball, a contacting section located above and connected to the positioning section via a second flexible neck. The first flexible neck is deformable to absorb a tension originated from the plate. The second flexible neck is deformable to force the contacting section to abut against an external electrical device such as a CPU package when the external electrical device urges the contacting section to electrically connect to the solder ball via the contact.

In accordance with another aspect of the present invention, a connector comprises an insulative housing in which a plurality of passageways are defined. A plurality of contacts are received in the passageways. Each contact comprises an engagement plate firmly retained in the passageway in a vertical manner, a first positioning section connected to the engagement plate via a first neck and maintained in a horizontal position, a second positioning section connected to the first positioning section via an intermediate section and maintained parallel to the first positioning section, and a contacting section connected to the second positioning section via a second neck. The contacting section is located beyond the passageway and a solder ball may be selectively mounted onto either one of the first positioning section and the second positioning section.

DETAILED DESCRIPTION OF THE PREFERRED EMBODIMENT

Figure 1:
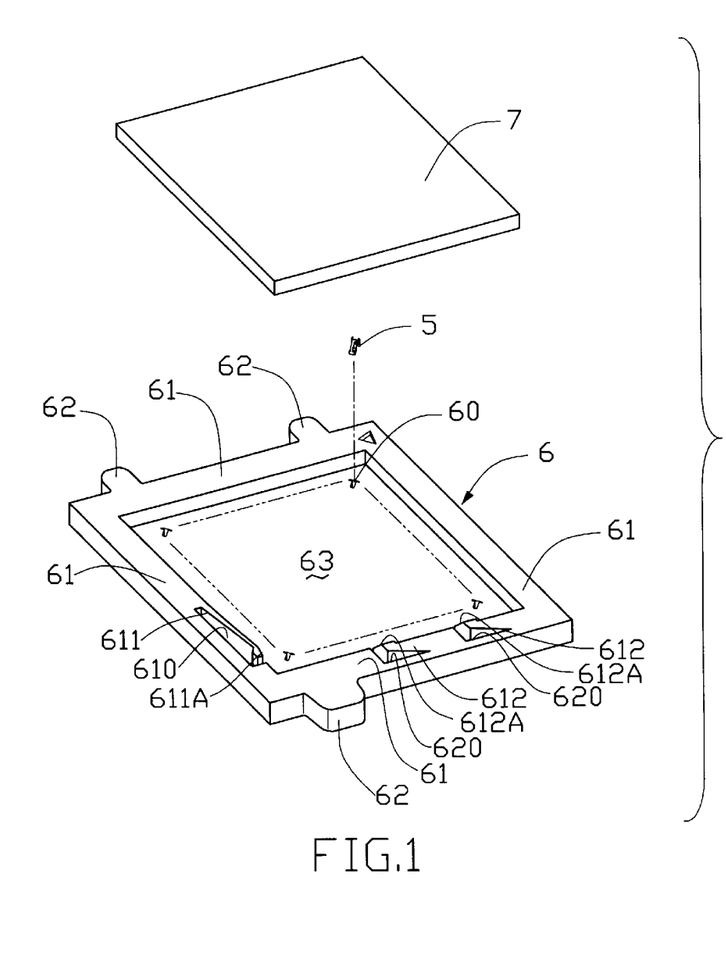
FIG. 1 is a connector in accordance with the present invention for receiving a CPU package.
Figure 2:
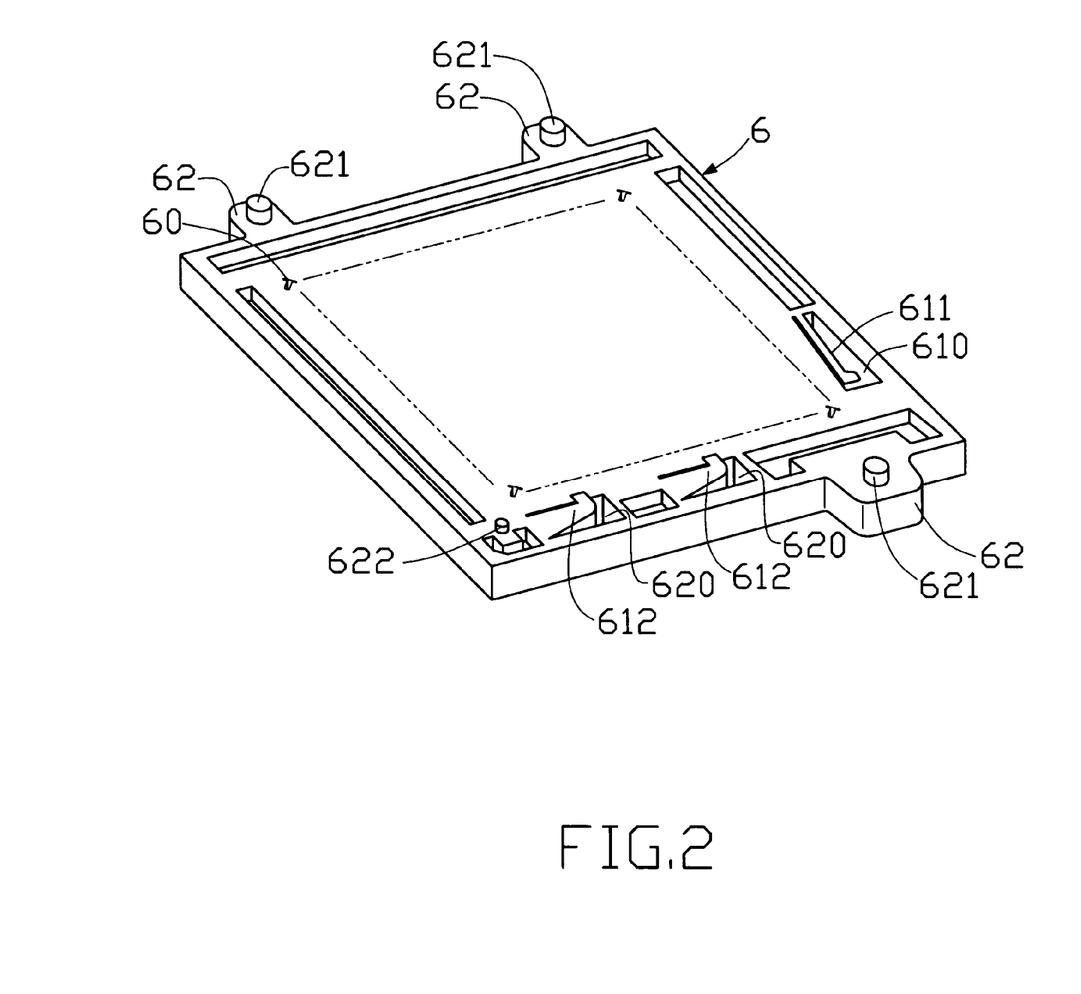
FIG. 2 is a perspective view of the LGA socket of FIG. 1 taken from an opposite direction.

Referring to FIGS. 1 and 2, a connector in accordance with the present invention comprises an insulative housing 6 defining a plurality of passageways 60 therein for receiving contacts 5. The housing 6 is substantially a body having four raised sides 61 and a central cavity 63 defined between the four raised sides 61 and sized to receive an IC package such as a CPU package 7. The passageways 60 are defined through a bottom surface of the central cavity 63. The contact 5 is received in each of the passageways 60. A first resilient arm 611 is formed in one of the four raised sides 61 and capable of deformation in a first space 610 defined in the raised side 61. Two second resilient arms 612 are formed in another raised side 61 adjacent to the one in which the first resilient arm 611 is formed. The second resilient arm 612 is capable of deformation in a second space 620 defined in the raised side 61. The first resilient arm 611 and the second resilient arms 612 each have a chamfer surface 611A, 612A respectively formed in an upper edge thereof for guiding insertion of the CPU package 7 to the central cavity 63. The CPU package 7 is fixed in the cavity 63 by normal force originated from the deformation of the resilient arms 611, 612. Three ears 62 extend from opposite raised sides 61 near three corner of the housing 6 and each ear 62 has a post 621 extending downward for engagement within openings (not shown) of a printed circuit board 9 (see FIG. 6). Similarly, an additional post 622 extending from the bottom of the housing 6 near another corner thereof for engagement within another opening (not shown) of the printed circuit board 9.

Figure 3:
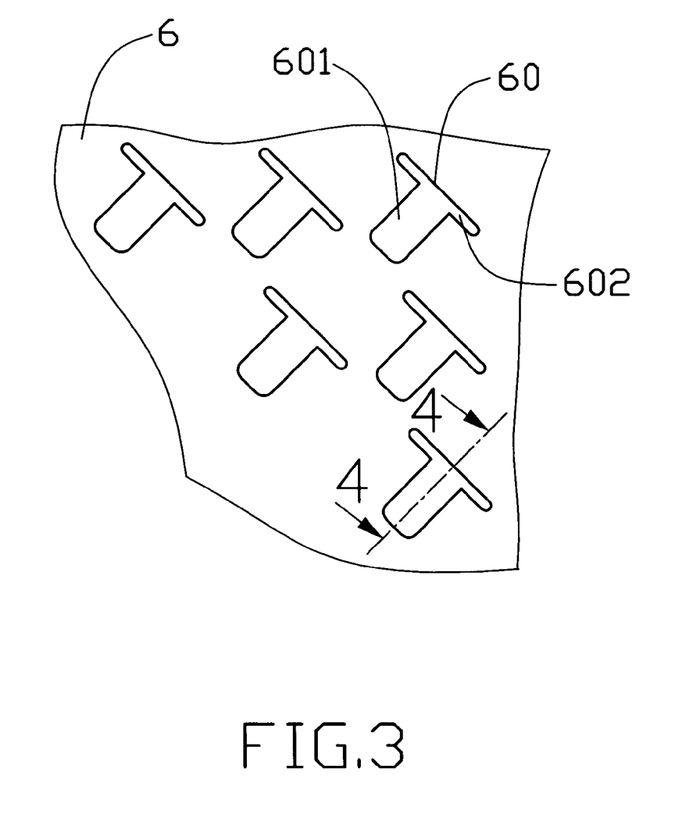
FIG. 3 is an enlarged top view of several passageways of FIG. 1.
Figure 4:
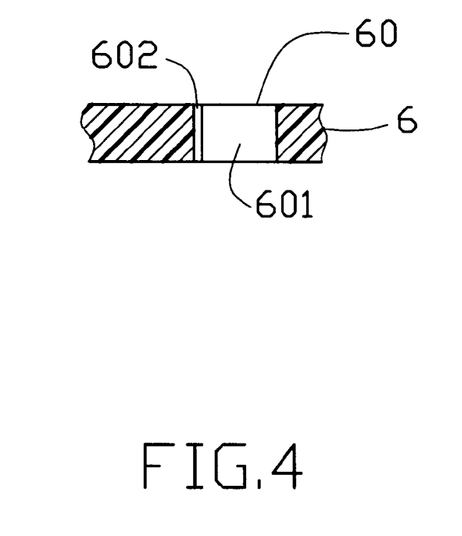
FIG. 4 is a cross-sectional view taken from line 44 of FIG. 3.

Referring to FIGS. 3 and 4, each passageway 60 has a T-shape in cross-section and comprises a longitudinal hole 601 and a lateral hole 602 communicating with and perpendicular to the longitudinal hole 601. The longitudinal hole 601 is wider than the lateral hole 602.

Figure 5:
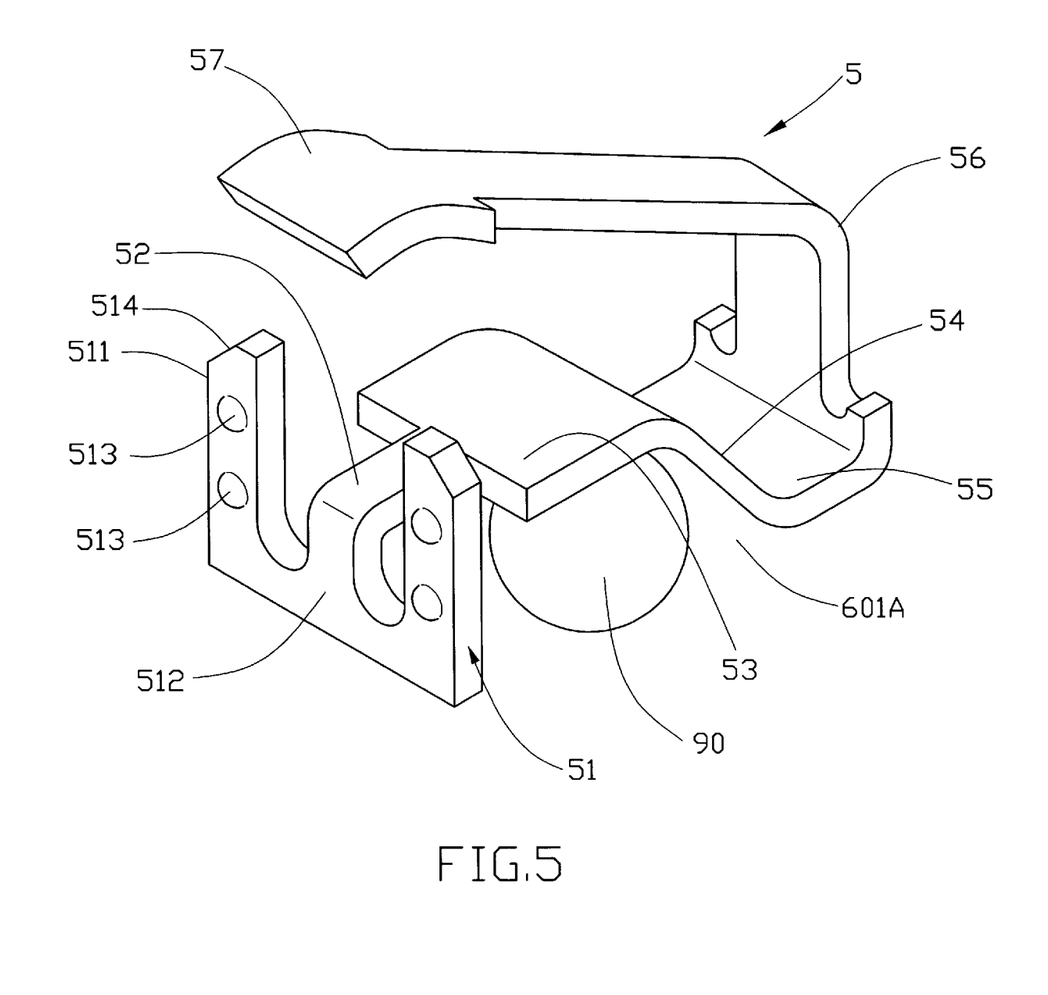
FIG. 5 is an enlarged perspective view of the contact shown in FIG. 1.
Figure 6:
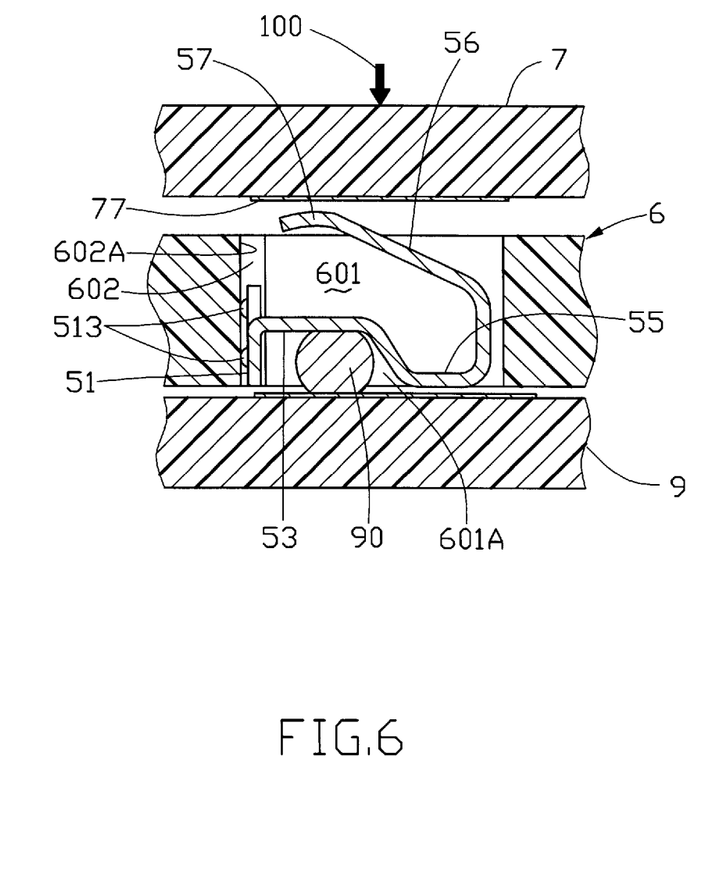
FIG. 6 is a schematic view showing that the connector of the present invention has been mounted on a printed circuit board while not yet surged by an IC package.

Referring to FIGS. 5 and 6, the CPU package 7 has a plurality of contact pads 77 (only one is shown for simplicity) and the printed circuit board 9 also has a plurality of contact pads 99 (only one is shown)and each pair of contact pads 77, 99 are arranged to register with each other when the CPU package 7 and the printed circuit board 9 sandwich the connector. The contact 5 comprises a U-shaped engagement plate 51, a first curved neck 52 extending from the U-shaped engagement plate 51, a first positioning section 53 connected to the first curved neck 52, a slope section 54 connected to the first positioning section 53, a second positioning section 55 connected to the slope section 54, a second curved neck 56 connected to the second positioning section 55, and a contacting section 57 connected to the second curved neck 56. The first curved neck 52 and the second curved neck 56 are made relatively narrow for increasing their flexibility. The contacting section 57 is located in the highest position of the contact 5 extending beyond a very upper portion of the passageway 60 and the second positioning section 55 is located in the lowest position of the contact 5 substantially registering with a very lower portion of the passageway 60. A reception space 601A is defined between the U-shaped engagement plate 51, the first positioning section 53, and the slope section 54.

The U-shaped engagement plate 51 has two vertical sections 511 connected by a horizontal section 512. Each vertical section 511 has a tapered head 514 for facilitating loading of the contact into the passageway 60 from a bottom direction. Each vertical section 511 has two protrusions 513 formed by stamping and projecting outward for engagement with an inner wall 602A adjacent the lateral hole 602 by interference. The first curved neck 52 extends upward from the center of the horizontal section 512 and then bent for substantially 90 degrees. The first positioning section 53, the second positioning section 55, and the contacting section 57 retain parallel to each other and the first positioning section 53 is located in a horizontal position between the horizontal positions of the contacting section 57 and the second positioning section 55.

A solder ball 90 is soldered onto the first positioning section 53 in advance and then soldered onto a solder pad 99 of the printed circuit board 9 as shown in FIG. 6. With this structure, the connector can be fixed on the printed circuit board 9 in advance via the solder balls 90. The connector together with the solder balls 90 may be maintained in a relatively low profile because the reception space 602A can accommodate most portions of the solder ball 90. Normally, the solder ball 90 may be damaged due to different coefficients of thermal expansion (CTE)between the plastic materials of the connector and the printed circuit board 9. When the connector experiences a soldering procedure, a relatively high temperature will cause the plastic material of the connector to expand which in turn generates tension passing to the first curved neck 52 via the engagement plate 51. Similarly, the printed circuit board 9 expands in response to the relatively high temperature. Since the CTEs of the connector and the printed circuit board 9 are different, a torsion will be generated between the connector and the printed circuit board 9 and damage the solder ball 90. Therefore, the first curved neck 52 especially the bent portion thereof may deform to absorb some of the torsion due to different CTEs between the connector and the printed circuit board 9.

Figure 7:
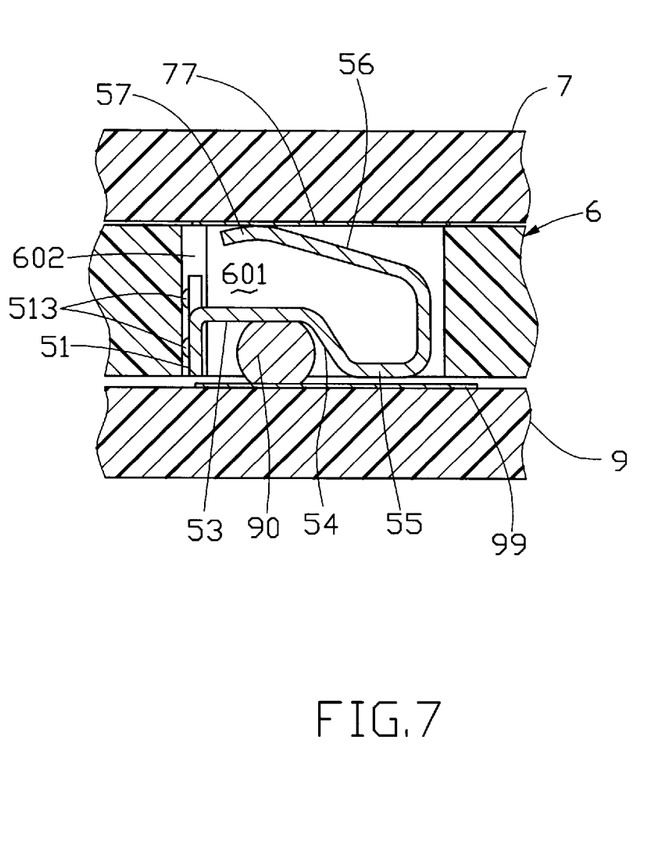
FIG. 7 is a schematic view showing that the connector has been urged by an IC package.

Referring to FIG. 7, the CPU package 7 having a plurality of contact pads 77 (only one is shown) is urged to the contacting sections 57 of the connector in a direction 100 and each second curved neck 56 is deformed to force the contacting section 57 to abut against the contact pad 77 of the CPU package 7 so that each contact pad 77 of the CPU package 7 is electrically connected to a corresponding one of the solder pads 99 of the printed circuit board 9 via the contact 5.

Figure 8:
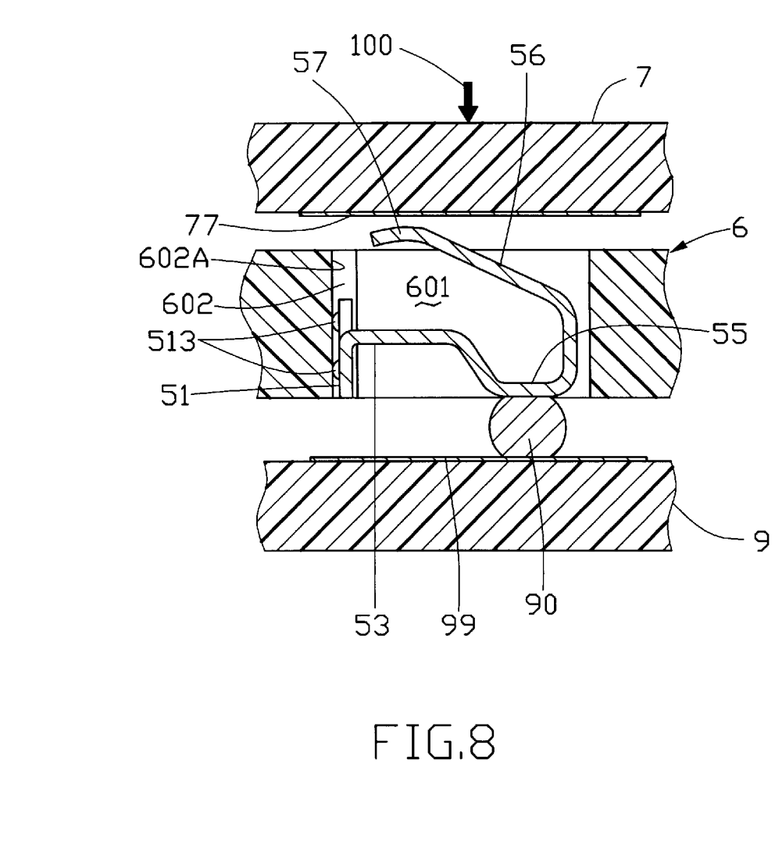
FIG. 8 is a schematic view similar to FIG. 6 except that the solder ball is positioned in different place of the connector.
Figure 9:
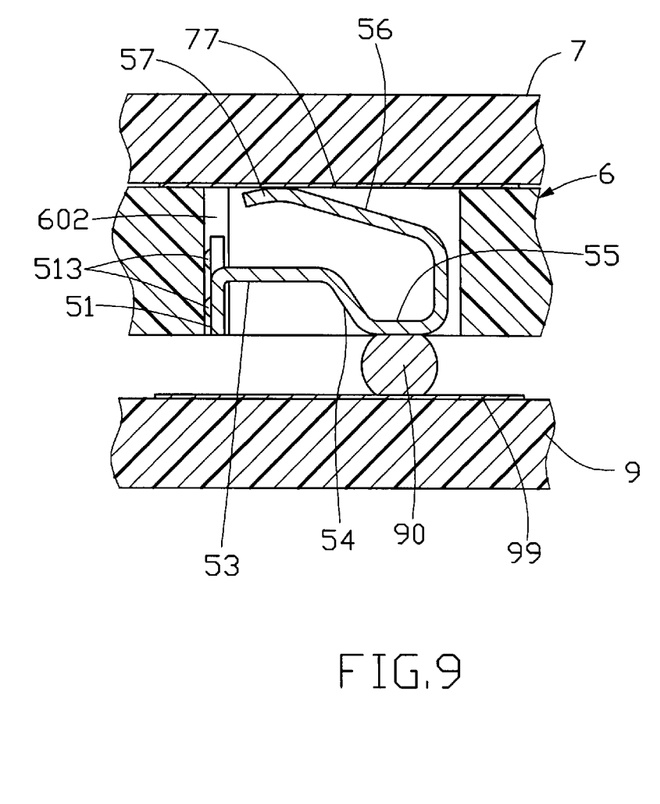
FIG. 9 is a schematic view showing that the connector has been urged by an IC package.

If low profile is not a critical consideration, the solder ball 90 may be soldered onto the second positioning section 55 (FIG. 8) and then the CPU package 7 may be urged to the connector (FIG. 9). If the solder ball 90 is soldered onto the second positioning section 55, the well known CTE problem may be more effectively solved by deformation on the bent portion of the first curved neck 52 and the interconnections of the slope section 54 to the first positioning section 53 and the second positioning section 55. Moreover, it is easier to surface mount the solder ball 90 onto the second positioning section 55 rather than mount it onto the first positioning section 53 because the second positioning section 55 directly exposes to external from the passageway 60 while the first positioning section 53 is located inside the passageway 60. The second curved neck 56 is a substantially L-shaped structure which may prevent wicking problem from occurring on the contacting section 57 because its L-shaped structure and length prohibit melted solder portion from passing to the contacting section 57 thereby. The contacting section 57 is made particularly wider than the second curved neck 56.

Alternatively, the contact 5 may be loaded into the passageway 60 in such a way that the second positioning section 55 extends beyond the very lower portion of the passageway 60 for directly positioning on the contact pad 99 of the printed circuit board 9 via surface mount without the interconnection of the solder ball 90. The related drawing is omitted herein because it is quite similar to that of FIG. 8 and any skilled can appreciate from the description.

It should be deemed as a feature that the contact 5 of the present invention provides selective mounting positions 53, 55 for the solder ball 90. The user may select one of the positioning sections 53, 55 for mounting the solder ball 90 according to his demand. For example, to achieve low profile requirement, the user had better choose the first positioning section 53 for surface mounting the solder ball 90 thereon, while to solve the CTE problem more effectively, the user had better choose the second positioning section 55 for surface mounting the solder ball 90.

While the present invention has been described with reference to a specific embodiment, the description is illustrative of the invention and is not to be construed as limiting the invention. Therefore, various modifications to the present invention can be made to the preferred embodiment by those skilled in the art without departing from the true spirit and scope of the invention as defined by the appended claims.

What is claimed is:

1. A connector comprising an insulative housing in which a plurality of passageways are defined;

a plurality of contacts are received in the passageways;

each contact comprising an engagement plate firmly retained in the passageway, a positioning section connected to the engagement plate via a first flexible neck and adapted to be mounted by an external solder ball thereon, a contacting section located above and connected to the positioning section via a second flexible neck, wherein the first flexible neck is deformable to absorb a tension originated from the engagement plate when the connector experience an abrupt high temperature, and wherein the second flexible neck is deformable to force the contacting section to abut against an external electrical device when the external electrical device urges the contacting section to electrically connect to the solder ball via the contact;

wherein each passageway has a longitudinal hole and a lateral hole communicating with and perpendicular to the longitudinal hole;

wherein the engagement plate of the contact is firmly retained in the lateral hole of the passageway;

wherein the engagement plate is a U-shaped structure having two vertical sections connected by a horizontal section and the first flexible neck extends from a center portion of the horizontal section;

wherein each vertical section of the engagement plate has at least one protrusion extending therefrom for engaging with a wall facing the lateral hole;

wherein the positioning section of each contact is retained in a horizontal position.

2. The connector as claimed in claim 1, wherein the positioning section of each contact is located at the lowest position with respect to the contact.

3. The connector as claimed in claim 1, wherein the positioning section of each contact is located above a lowest point of the contact.

* * * * *